(12) United States Patent
Liu et al.

(10) Patent No.: US 11,683,060 B2
(45) Date of Patent: Jun. 20, 2023

(54) RADIO FREQUENCY CIRCUIT WITH FONT ROUTING TO REPLACE RESISTOR

(71) Applicant: USI Science and Technology (Shenzhen) Co., Ltd., Guangdong Province (CN)

(72) Inventors: Wen-Shuo Liu, Guangdong Province (CN); Ji-Min Lin, Guangdong Province (CN); Syuan-Ci Lin, Guangdong Province (CN); Yu-An Hsieh, Guangdong Province (CN)

(73) Assignee: USI Science and Technology (Shenzhen) Co., Ltd., Guangdong Province (CN)

( * ) Notice: Subject to any disclaimer, the term of this patent is extended or adjusted under 35 U.S.C. 154(b) by 5 days.

(21) Appl. No.: 17/583,218

(22) Filed: Jan. 25, 2022

(65) Prior Publication Data

US 2023/0126592 A1    Apr. 27, 2023

(30) Foreign Application Priority Data

Oct. 26, 2021  (CN) .......................... 202111247028.1

(51) Int. Cl.
*H04B 1/16*      (2006.01)
*H04B 1/18*      (2006.01)
*H05K 1/02*      (2006.01)

(52) U.S. Cl.
CPC ............. *H04B 1/1607* (2013.01); *H04B 1/18* (2013.01); *H05K 1/0296* (2013.01)

(58) Field of Classification Search
CPC .......... H04B 1/16; H04B 1/1607; H04B 1/18; H04B 1/38; H04B 1/40; H04M 1/02; H04M 1/026; H04M 1/0274; H04M 1/0277; H05K 1/0296; H05K 1/0298; H05K 1/03; H05K 1/11; H05K 1/111; H05K 1/117; H05K 1/16; H05K 1/167; H05K 1/18; H05K 1/181; H05K 1/182
See application file for complete search history.

(56) References Cited

U.S. PATENT DOCUMENTS

| | | | |
|---|---|---|---|
| 9,064,622 B2* | 6/2015 | Len ..................... | H05K 1/0265 |
| 9,264,077 B2* | 2/2016 | Shaw ..................... | H04B 1/18 |
| 10,454,436 B2* | 10/2019 | Chu ..................... | H04B 1/18 |
| 10,873,349 B1* | 12/2020 | Bit-Babik ............... | H04B 1/18 |
| 2007/0241456 A1 | 10/2007 | Chao et al. | |
| 2023/0014716 A1* | 1/2023 | English ............. | G01R 31/2808 |

* cited by examiner

*Primary Examiner* — Quochien B Vuong
(74) *Attorney, Agent, or Firm* — CKC & Partners Co., LLC (57) ABSTRACT

A radio frequency circuit with font routing to replace a resistor includes a routing layer and a ground layer. The routing layer includes a first pad, a second pad and a font routing unit. The second pad is corresponding to the first pad. The font routing unit is connected between the first pad and the second pad, and has a trace width. The trace width is less than a 50 ohm trace width. The ground layer is disposed below the routing layer and is separated from the routing layer by a height. The font routing unit has a second equivalent impedance at the radio frequency, the second equivalent impedance is determined according to the trace width, the height and the radio frequency, and the second equivalent impedance is the same or similar to a first equivalent impedance.

10 Claims, 6 Drawing Sheets

RADIO FREQUENCY CIRCUIT WITH FONT ROUTING TO REPLACE RESISTOR

RELATED APPLICATIONS

This application claims priority to China Application Serial Number 202111247028.1, filed Oct. 26, 2021, which is herein incorporated by reference.

BACKGROUND

Technical Field

The present disclosure relates to a radio frequency circuit. More particularly, the present disclosure relates to a radio frequency circuit with font routing to replace a resistor.

Description of Related Art

Figure 1:
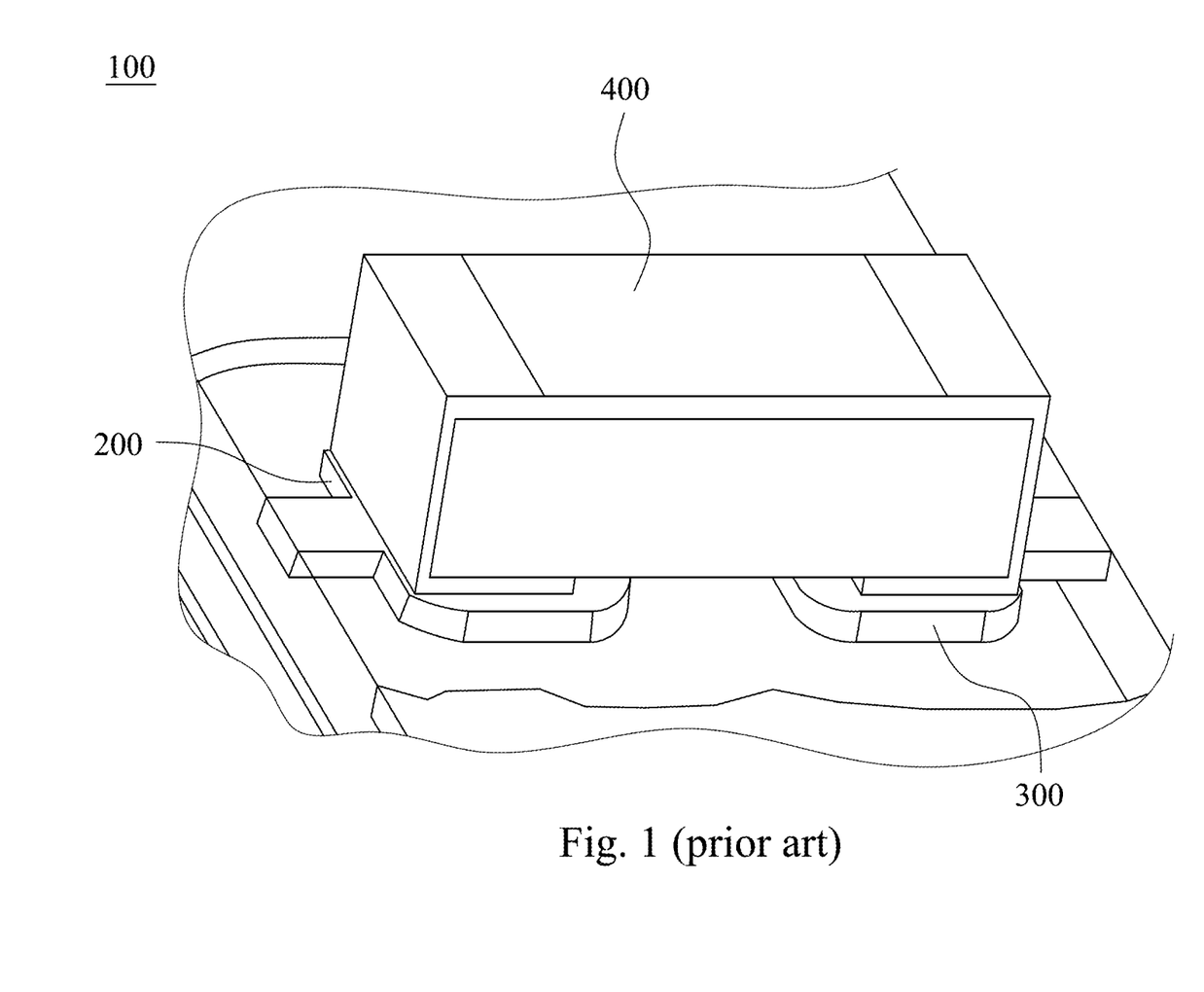
FIG. 1 shows a three-dimensional schematic view of a conventional radio frequency circuit with a resistor.

Due to the microminiaturization of the electronic product, and different radio frequency (RF) products with different RF technologies may interfere each other while existing in a same system. Additional matching circuit should be reserved on the radio frequency circuit to solved problems of interference and mismatching. FIG. 1 shows a three-dimensional schematic view of a conventional radio frequency circuit 100 with a resistor. The aforementioned radio frequency circuit 100 includes a first pad 200, a second pad 300 and a resistor 400, and the resistor 400 is connected between the first pad 200 and the second pad 300. The substituting resistor 400 is an additional cost for products.

If the manufacturers remove the substituting resistor 400 for reducing the cost, the conventional method for maintaining the original impedance matching and the performance of the radio frequency is to adjust the matching circuit. However, when it comes to high frequency of WIFI 5 G, the matching circuit need to be adjusted substantially, all the radio frequency testing must be measured again, and the manufacturing cost and time may increase. Thus, developing a radio frequency circuit with font routing to replace a resistor for reducing the manufacturing cost, without readjusting the matching circuit and measuring the radio frequency testing again is commercially desirable.

SUMMARY

According to one aspect of the present disclosure, a radio frequency circuit with font routing to replace a resistor is configured to replace the resistor. The resistor has a first equivalent impedance at a radio frequency. The radio frequency circuit with font routing to replace the resistor includes a routing layer and a ground layer. The routing layer includes a first pad, a second pad and a font routing unit. The second pad is corresponding to the first pad. The font routing unit is connected between the first pad and the second pad, and has a trace width. The trace width is less than a 50 ohm trace width. The ground layer is disposed below the routing layer and separated from the routing layer by a height. The font routing unit has a second equivalent impedance at the radio frequency, the second equivalent impedance is determined according to the trace width, the height and the radio frequency, and the second equivalent impedance is the same or similar to the first equivalent impedance.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "coupled to" another element, it can be directly coupled to the other element, or it can be indirectly coupled to the other element, that is, intervening elements may be present. In contrast, when an element is referred to as be "directly coupled to" another element, there are no intervening elements present. In addition, the terms first, second, third, etc. are used herein to describe various elements or components, these elements or components should not be limited by these terms. Consequently, a first element or component discussed below could be termed a second element or component.

Figure 2:
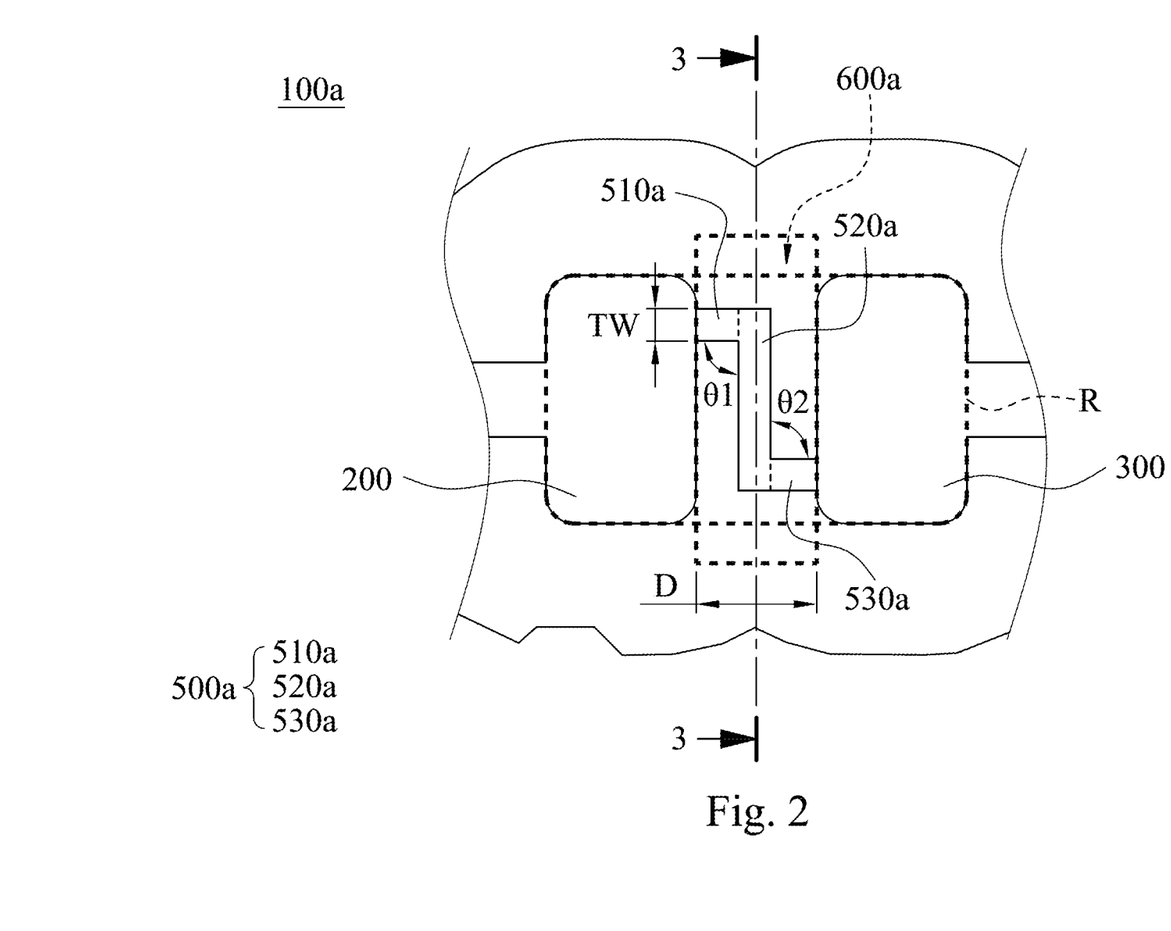
FIG. 2 shows a three-dimensional schematic view of a radio frequency circuit with font routing to replace a resistor according to a first embodiment of the present disclosure.
Figure 3:
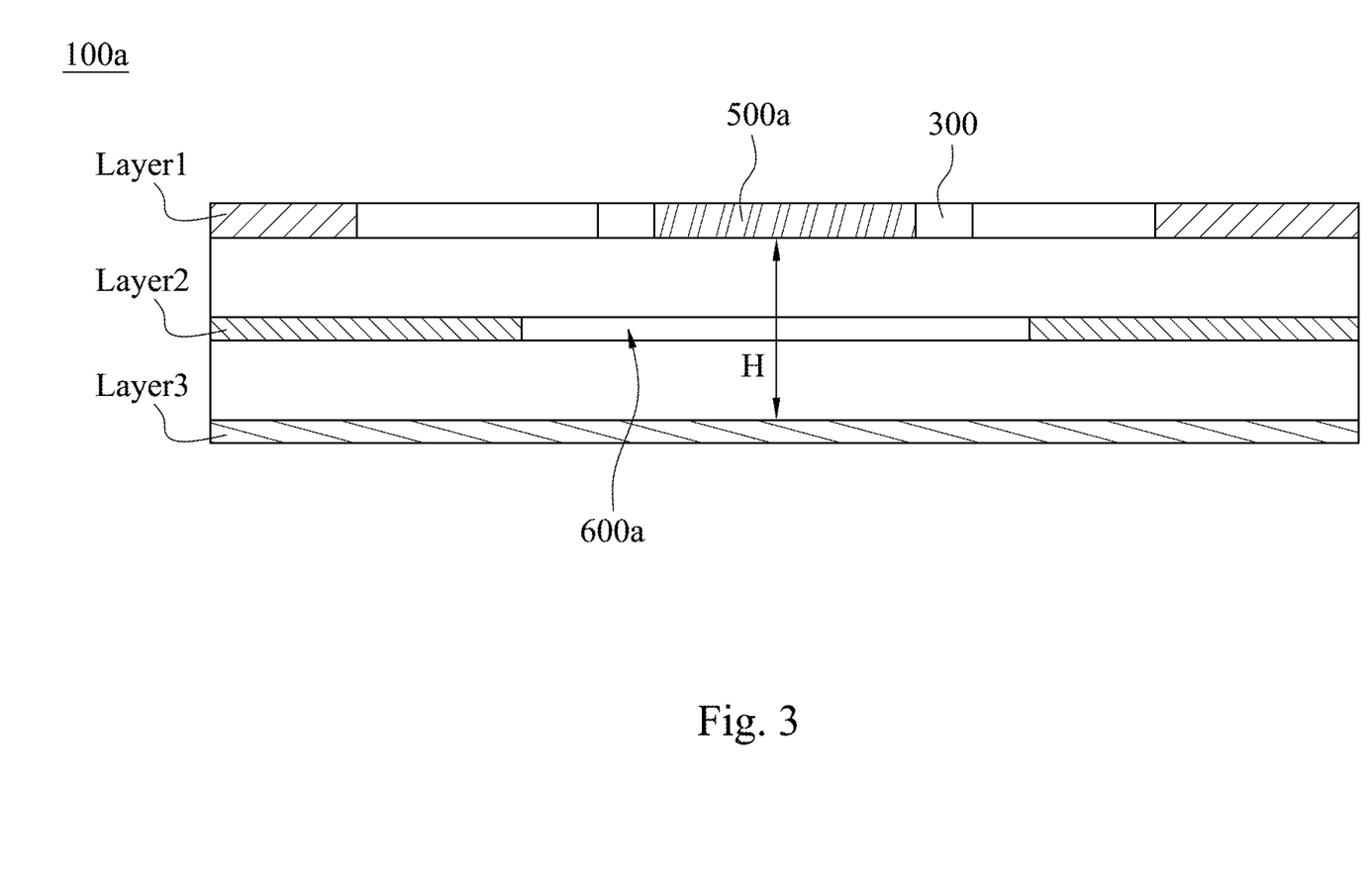
FIG. 3 shows a cross-sectional view of the radio frequency circuit with font routing to replace the resistor taken along line 3-3 in FIG. 2.

Please refer to FIG. 1, FIG. 2 and FIG. 3. FIG. 2 shows a three-dimensional schematic view of a radio frequency circuit 100a with font routing to replace a resistor according to a first embodiment of the present disclosure. FIG. 3 shows a cross-sectional view of the radio frequency circuit 100a with font routing to replace the resistor taken along line 3-3 in FIG. 2. The radio frequency circuit 100a with font routing to replace the resistor is configured to replace the resistor 400 in FIG. 1. The resistor 400 has a first equivalent impedance at a radio frequency. The radio frequency circuit 100a with font routing to replace the resistor includes a routing layer Layer1 and a ground layer Layer3.

The routing layer Layer1 includes a first pad 200, a second pad 300 and a font routing unit 500a. The second pad 300 is corresponding to the first pad 200. The font routing unit 500a is connected between the first pad 200 and the second pad 300, and has a trace width TW. The trace width TW is less than a 50 ohm trace width. The ground layer Layer3 is disposed below the routing layer Layer1 and separated from the routing layer Layer1 by a height H. The font routing unit 500a has a second equivalent impedance at the radio frequency. The second equivalent impedance is determined according to the trace width TW, the height H and the radio frequency, and the second equivalent impedance is the same or similar to the first equivalent impedance. Thus, the radio frequency circuit 100a with font routing to replace the resistor of the present disclosure combines the pad of the original circuit with the font routing unit 500a and the ground layer Layer3 to let the high frequency impedance characteristic equivalent to characteristic of the substituting resistor 400, so the font routing unit 500a can replace the resistor 400 directly without affecting impedance matching at the radio frequency. Moreover, the font routing unit 500a of the present disclosure replaces the substituting resistor 400, and the equivalent impedance characteristic of the font routing unit 500a can avoid adjusting the matching circuit again and measuring the RF testing again, so that the manufacturing cost and time effectiveness can be substantially reduced.

In detail, the resistor 400 is a 0 ohm resistor. The radio frequency is equal to or less than 10 GHz, that is, all of the wireless communication system with frequency below 10 GHz can be covered. In the routing layer Layer1, the first pad 200 and the second pad 300 are both pads of a surface mount device (SMD). The first pad 200 is spaced from the second pad 300 by a gap D. An area R is formed between the first pad 200 and the second pad 300, and a size of the area R is conformed to one of a regulation size 0201, a regulation size 0402 and a regulation size 0603 of the SMD. The regulation size 0201 has a first length and a first width, and the first length and the first width are 0.6 mm and 0.3 mm, respectively. The regulation size 0402 has a second length and a second width, and the second length and the second width are 1.0 mm and 0.5 mm, respectively. The regulation size 0603 has a third length and a third width, and the third length and the third width are 1.6 mm and 0.8 mm, respectively.

In the embodiment of FIG. 2, a shape of the font routing unit 500a is a Z-shape, and the font routing unit 500a includes a first transmitting line 510a, a second transmitting line 520a and a third transmitting line 530a. The first transmitting line 510a is connected to the first pad 200. The second transmitting line 520a is connected to the first transmitting line 510a. The third transmitting line 530a is connected between the second transmitting line 520a and the second pad 300. The first transmitting line 510a, the second transmitting line 520a and the third transmitting line 530a are all disposed between the first pad 200 and the second pad 300. A first angle θ1 is formed between the first transmitting line 510a and the second transmitting line 520a, a second angle θ2 is formed between the second transmitting line 520a and the third transmitting line 530a, and the first angle θ1 is equal to the second angle θ2. Moreover, the font routing unit 500a has a trace length, and the trace length is equal to a total length of the first transmitting line 510a, the second transmitting line 520a and the third transmitting line 530a. In one embodiment, the first angle θ1 can be 90 degrees, the trace length can be equal to 16 mil, and the trace width TW can be equal to 2 mil, but the present disclosure is not limited thereto.

The radio frequency circuit 100a with font routing to replace the resistor further includes another ground layer Layer2. The ground layer Layer2 is disposed between the routing layer Layer1 and the ground layer Layer3. The ground layer Layer2 has a through hole 600a, and the through hole 600a is corresponding to the font routing unit 500a of the routing layer Layer1. The through hole 600a can enhance the conductivity of the font routing unit 500a at the radio frequency, and let a second equivalent impedance of the font routing unit 500a is the same or similar to the first equivalent impedance of the resistor 400 with 0 ohm resistance. The ground layer Layer2 and the ground layer Layer3 are both grounded and disposed below the routing layer Layer1. The routing layer Layer1 and the ground layers Layer2, Layer3 are all disposed on a printed circuit board (PCB), and the PCB is one of a FR4 PCB and a ceramic PCB. In one embodiment, the height H between the routing layer Layer1 and the ground layer Layer3 can be equal to 0.6 times to 3.5 times of the 50 ohm trace width. Preferably, the height H can be equal to 1.4 times of the 50 ohm trace width. In another embodiment, the height H can be greater than or equal to 2 mil, and less than or equal to 15 mil, but the present disclosure is not limited thereto.

For instance, Table 1 lists the impedance of the smith chart of the radio frequency circuit 100a with font routing to replace the resistor of the present disclosure, the 0 ohm resistor and a 50 ohm trace width at different radio frequencies (i.e., 1 GHz, 2.44 GHz and 5.85 GHz). Table 2 lists a deviation of the imaginary parts of the impedance of the 0 ohm resistor compared with the radio frequency circuit 100a with font routing to replace the resistor of the present disclosure and 50 ohm trace width at different radio frequencies. In Table 1 and Table 2, the first equivalent impedance of the resistor 400 (0 ohm resistor) at 5.85 GHz is 48.52-j4.59, the second equivalent impedance of the font routing unit 500a at 5.85 GHz is 48.41-j5.29. In other words, when the radio frequency is 5.85 GHz (WIFI 5 G), the deviation of the imaginary part of the impedance between the radio frequency circuit 100a with font routing to replace the resistor of the present disclosure and the 0 ohm resistor is only 0.7 ohm (5.29 ohm subtracts 4.59 ohm), and the deviation of the imaginary part of the impedance between the conventional 50 ohm trace width (i.e., the conventional pads are connected with 50 ohm trace width) and the 0 ohm resistor is 3.72 ohm (8.31 ohm subtracts 4.59 ohm), hence the present disclosure improves the deviation of 3.02 ohm (3.72 ohm subtracts 0.7 ohm) of the impedance.

TABLE 1

| Impedance of smith chart | | | |
| --- | --- | --- | --- |
| Radio frequency | 1GHz | 2.44 GHz | 5.85 GHz |
| 0 ohm resistor | 50.01-j0.87 | 49.74-j2.10 | 48.52-j4.59 |
| 50 ohm trace width | 49.91-j1.53 | 49.50-j3.70 | 47.49-j8.31 |
| The present disclosure | 49.96-j0.96 | 49.71-j2.34 | 48.41-j5.29 |

TABLE 2

| Deviation of the imaginary part of the impedance (compare with 0 ohm resistor) | | | |
| --- | --- | --- | --- |
| Radio frequency | 1 GHz | 2.44 GHz | 5.85 GHz |
| 50 ohm trace width | −0.66 | −1.60 | −3.72 |
| The present disclosure | −0.09 | −0.24 | −0.70 |

Figure 4:
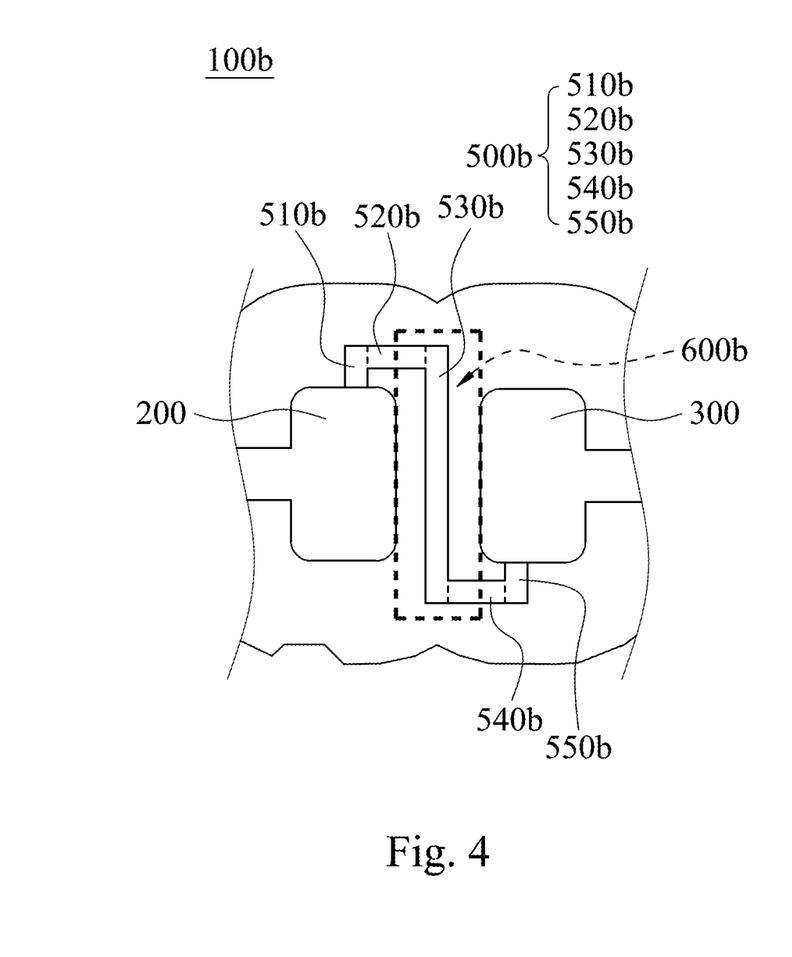
FIG. 4 shows a schematic view of a radio frequency circuit with font routing to replace a resistor according to a second embodiment of the present disclosure.

Please refer to FIG. 2, FIG. 3 and FIG. 4. FIG. 4 shows a schematic view of a radio frequency circuit 100b with font routing to replace a resistor according to a second embodiment of the present disclosure. The radio frequency circuit 100b with font routing to replace the resistor includes a routing layer Layer1 and ground layers Layer2, Layer3. The routing layer Layer1 includes a first pad 200, a second pad 300 and a font routing unit 500b. A shape of the font routing unit 500b is a Z-shape, and the font routing unit 500b includes a first transmitting line 510b, a second transmitting line 520b, a third transmitting line 530b, a fourth transmitting line 540b and a fifth transmitting line 550b. The first transmitting line 510b is connected to the first pad 200. The fifth transmitting line 550b is connected to the second pad 300. The first transmitting line 510b, the second transmitting line 520b, the third transmitting line 530b, the fourth transmitting line 540b and the fifth transmitting line 550b are connected in sequence. Furthermore, the ground layer Layer2 has a through hole 600b, and the through hole 600b is corresponding to a middle part of the font routing unit 500b of the routing layer Layer1.

Figure 5:
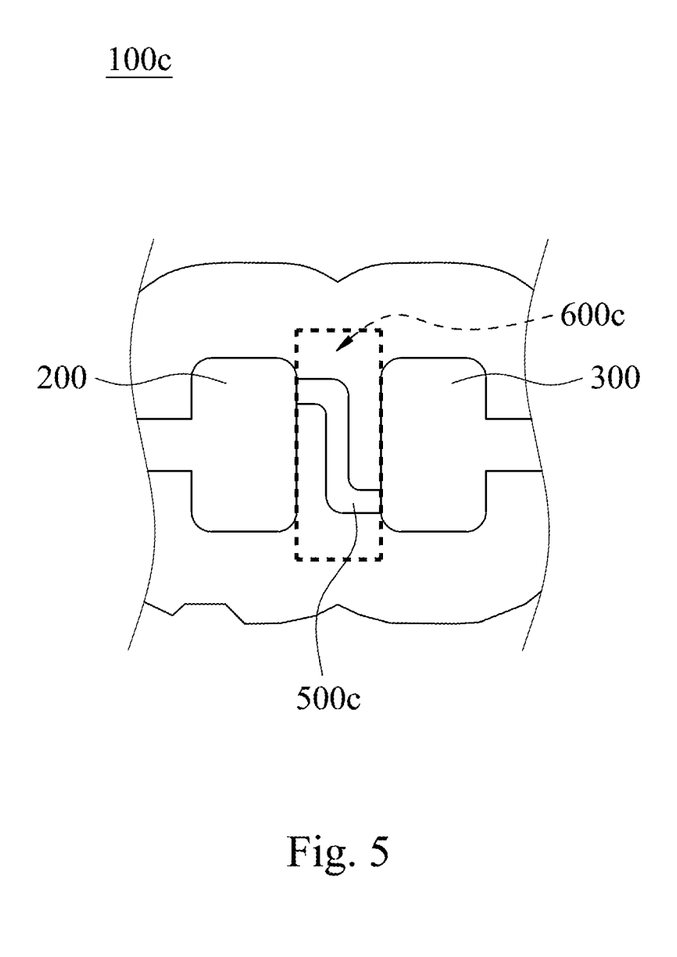
FIG. 5 shows a schematic view of a radio frequency circuit with font routing to replace a resistor according to a third embodiment of the present disclosure.

Please refer to FIG. 2, FIG. 3 and FIG. 5. FIG. 5 shows a schematic view of a radio frequency circuit 100c with font routing to replace a resistor according to a third embodiment of the present disclosure. The radio frequency circuit 100c with font routing to replace the resistor includes a routing layer Layer1 and ground layers Layer2, Layer3. The routing layer Layer1 includes a first pad 200, a second pad 300 and a font routing unit 500c. A shape of the font routing unit 500c is a Z-shape and is similar to the shape of the font routing unit 500a in FIG. 2. The difference between the font routing unit 500a and the font routing unit 500c is that the corner of the Z-shape becomes arc angle. Moreover, the ground layer Layer2 has a through hole 600c, and the through hole 600c is the same to the through hole 600a in FIG. 2, and will not be described again.

Figure 6:
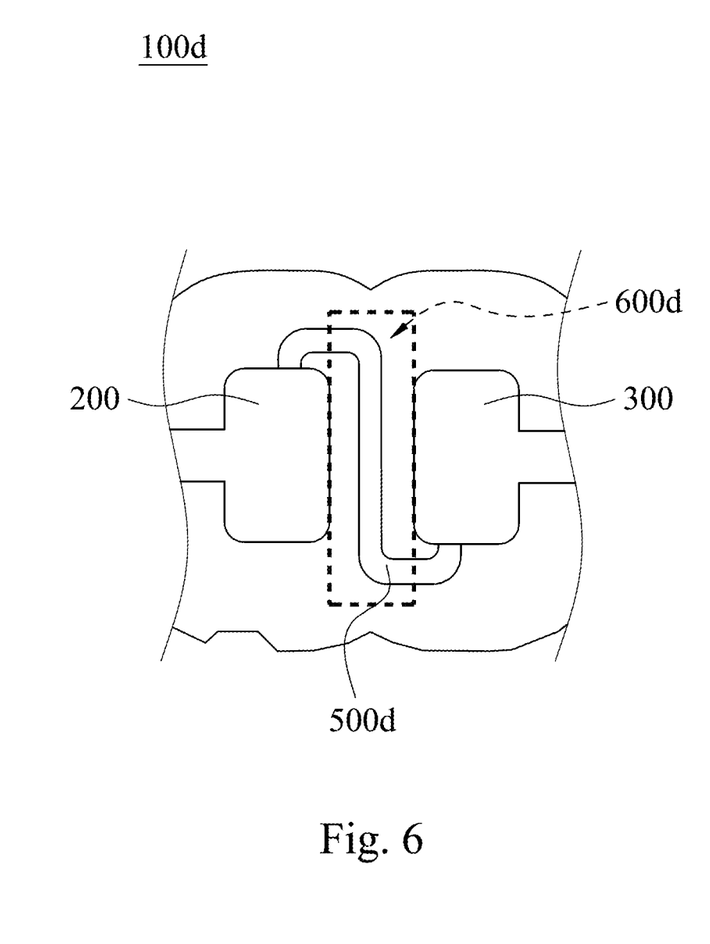
FIG. 6 shows a schematic view of a radio frequency circuit with font routing to replace a resistor according to a fourth embodiment of the present disclosure.

Please refer to FIG. 2, FIG. 3, FIG. 4 and FIG. 6. FIG. 6 shows a schematic view of a radio frequency circuit 100d with font routing to replace a resistor according to a fourth embodiment of the present disclosure. The radio frequency circuit 100d with font routing to replace the resistor includes a routing layer Layer1 and ground layers Layer2, Layer3. The routing layer Layer1 includes a first pad 200, a second pad 300 and a font routing unit 500d. A shape of the font routing unit 500d is a Z-shape and is similar to the shape of the font routing unit 500b in FIG. 4. The difference between the font routing unit 500b and the font routing unit 500d is that the corner of the Z-shape becomes arc angle. Moreover, the ground layer Layer2 has a through hole 600d, and the through hole 600d is the same as the through hole 600b in FIG. 4, and will not be described again.

Figure 7:
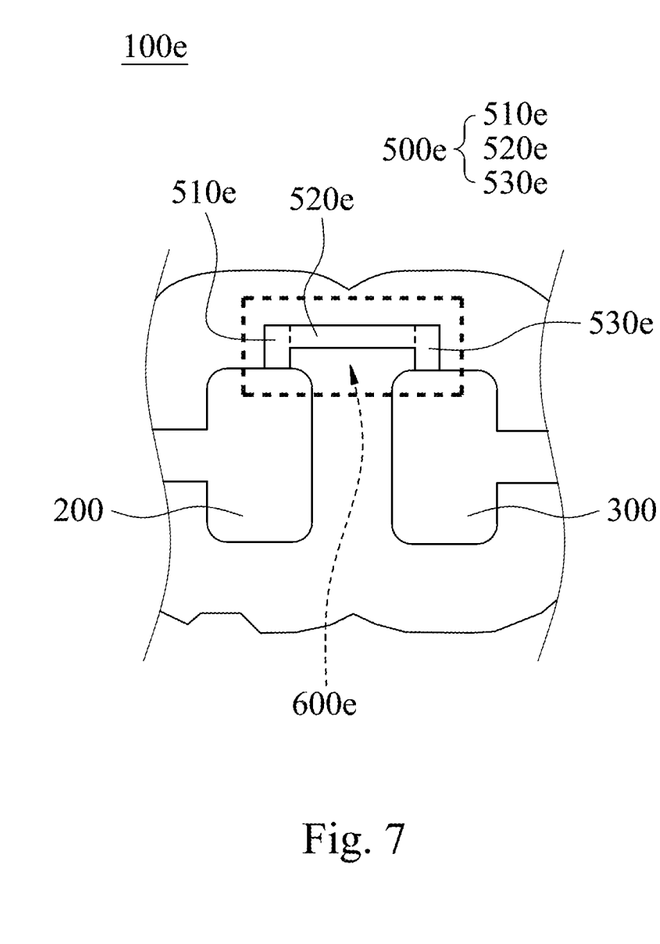
FIG. 7 shows a schematic view of a radio frequency circuit with font routing to replace a resistor according to a fifth embodiment of the present disclosure.

Please refer to FIG. 2, FIG. 3 and FIG. 7. FIG. 7 shows a schematic view of a radio frequency circuit 100e with font routing to replace a resistor according to a fifth embodiment of the present disclosure. The radio frequency circuit 100e with font routing to replace the resistor includes a routing layer Layer1 and ground layers Layer2, Layer3. The routing layer Layer1 includes a first pad 200, a second pad 300 and a font routing unit 500e. A shape of the font routing unit 500e is an inverted U-shape, and the font routing unit 500e includes a first transmitting line 510e, a second transmitting line 520e and a third transmitting line 530e. The first transmitting line 510e is connected between the first pad 200 and the second transmitting line 520e. The third transmitting line 530e is connected between the second pad 300 and the second transmitting line 520e. Furthermore, the ground layer Layer2 has a through hole 600e, and the through hole 600e is corresponding to the font routing unit 500e of the routing layer Layer1, an upper part of the first pad 200, and an upper part of the second pad 300.

Figure 8:
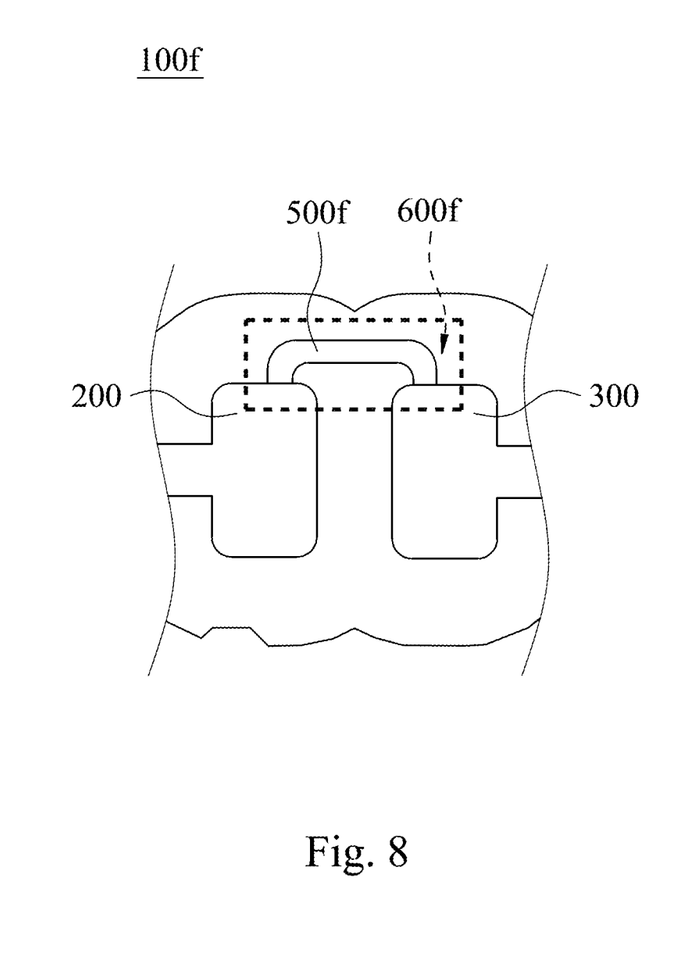
FIG. 8 shows a schematic view of a radio frequency circuit with font routing to replace a resistor according to a sixth embodiment of the present disclosure.

Please refer to FIG. 2, FIG. 3, FIG. 7 and FIG. 8. FIG. 8 shows a schematic view of a radio frequency circuit 100f with font routing to replace a resistor according to a sixth embodiment of the present disclosure. The radio frequency circuit 100f with font routing to replace the resistor includes a routing layer Layer1 and ground layers Layer2, Layer3. The routing layer Layer1 includes a first pad 200, a second pad 300 and a font routing unit 500f. A shape of the font routing unit 500f is an inverted U-shape and is similar to the shape of the font routing unit 500e in FIG. 7. The difference between the font routing unit 500e and the font routing unit 500f is that the corner of the inverted U-shape becomes arc angle. Moreover, the ground layer Layer2 has a through hole 600f, and the through hole 600f is the same as the through hole 600e in FIG. 7, and will not be described again.

Figure 9:
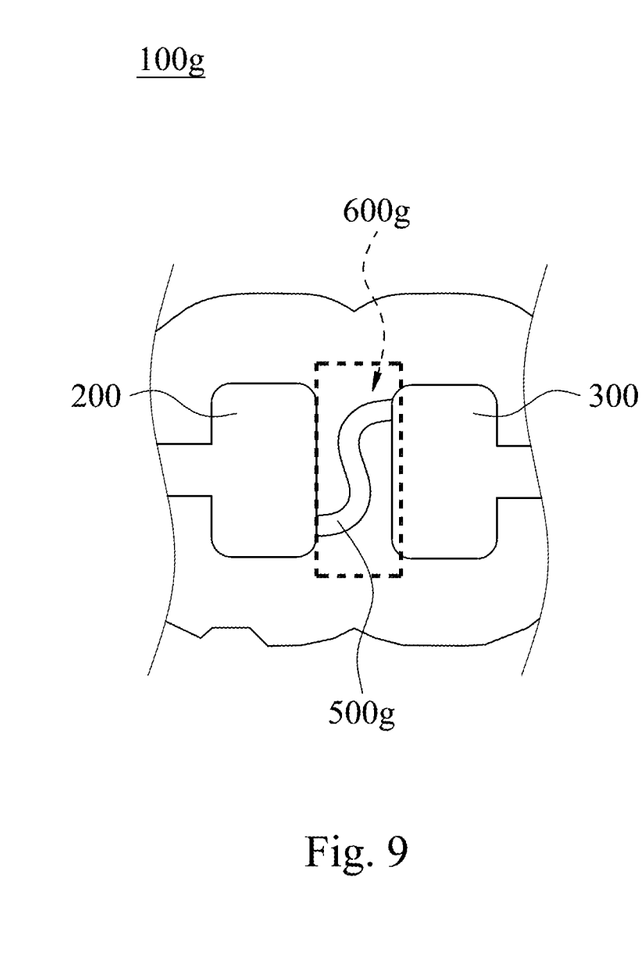
FIG. 9 shows a schematic view of a radio frequency circuit with font routing to replace a resistor according to a seventh embodiment of the present disclosure.

Please refer to FIG. 2, FIG. 3 and FIG. 9. FIG. 9 shows a schematic view of a radio frequency circuit 100g with font routing to replace a resistor according to a seventh embodiment of the present disclosure. The radio frequency circuit 100g with font routing to replace the resistor includes a routing layer Layer1 and ground layers Layer2, Layer3. The routing layer Layer1 includes a first pad 200, a second pad 300 and a font routing unit 500g. A shape of the font routing unit 500g is a S-shape, that is, the routing is a curve. Moreover, the ground layer Layer2 has a through hole 600g, and the through hole 600g is the same as the through hole 600a in FIG. 2, and will not be described again.

The effects of the aforementioned through holes 600b, 600c, 600d, 600e, 600f, 600g are the same as the through hole 600a in FIG. 2, the through holes 600b, 600c, 600d, 600e, 600f, 600g can increase the conductivity of the font routing units 500b, 500c, 500d, 500e, 500f, 500g at the radio frequency, and let the second equivalent impedance of each of the font routing units 500b, 500c, 500d, 500e, 500f, 500g be equal to or similar to the resistor 400 with 0 ohm resistance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A radio frequency circuit with font routing to replace a resistor, which is configured to replace the resistor, the resistor has a first equivalent impedance at a radio frequency, and the radio frequency circuit with font routing to replace the resistor comprising:
    a routing layer comprising:
        a first pad;
        a second pad corresponding to the first pad; and
        a font routing unit connected between the first pad and the second pad, and having a trace width, wherein the trace width is less than a 50 ohm trace width; and
    a ground layer disposed below the routing layer and separated from the routing layer by a height;
    wherein the font routing unit has a second equivalent impedance at the radio frequency, the second equivalent impedance is determined according to the trace width, the height and the radio frequency, and the second equivalent impedance is the same or similar to the first equivalent impedance.

2. The radio frequency circuit with font routing to replace the resistor of claim 1, further comprising:
   another ground layer disposed between the routing layer and the ground layer, wherein the another ground layer has a through hole, and the through hole is corresponding to the font routing unit of the routing layer.

3. The radio frequency circuit with font routing to replace the resistor of claim 1, wherein the height is greater than or equal to 2 mil, and less than or equal to 15 mil.

4. The radio frequency circuit with font routing to replace the resistor of claim 1, wherein the height is equal to 0.6 times to 3.5 times of the 50 ohm trace width.

5. The radio frequency circuit with font routing to replace the resistor of claim 1, wherein the first pad spaced from the second pad by a gap, an area is formed between the first pad and the second pad, a size of the area is conformed to one of a regulation size 0201, a regulation size 0402 and a regulation size 0603 of a surface mount device (SMD);
   wherein the regulation size 0201 has a first length and a first width, and the first length and the first width are 0.6 mm and 0.3 mm, respectively;
   wherein the regulation size 0402 has a second length and a second width, and the second length and the second width are 1.0 mm and 0.5 mm, respectively;
   wherein the regulation size 0603 has a third length and a third width, and the third length and the third width are 1.6 mm and 0.8 mm, respectively.

6. The radio frequency circuit with font routing to replace the resistor of claim 1, wherein the font routing unit further has a trace length, the trace length is equal to 16 mil, and the trace width is equal to 2 mil.

7. The radio frequency circuit with font routing to replace the resistor of claim 1, wherein the resistor is a 0 ohm resistor, and the radio frequency is less than or equal to 10 GHz.

8. The radio frequency circuit with font routing to replace the resistor of claim 1, wherein a shape of the font routing unit is one of a Z-shape, a S-shape and an inverted U-shape.

9. The radio frequency circuit with font routing to replace the resistor of claim 8, wherein the shape of the font routing unit is the Z-shape and comprises:
   a first transmitting line connected to the first pad;
   a second transmitting line connected to the first transmitting line; and
   a third transmitting line connected between the second transmitting line and the second pad;
   wherein the first transmitting line, the second transmitting line and the third transmitting line are all disposed between the first pad and the second pad, a first angle is formed between the first transmitting line and the second transmitting line, a second angle is formed between the second transmitting line and the third transmitting line, and the first angle is equal to the second angle.

10. The radio frequency circuit with font routing to replace the resistor of claim 1, wherein the routing layer and the ground layer are both disposed on a printed circuit board (PCB), and the PCB is one of a FR4 PCB and a ceramic PCB.

* * * * *